United States Patent
Takeuchi

(10) Patent No.: US 12,283,921 B2
(45) Date of Patent: Apr. 22, 2025

(54) METHODS AND APPARATUS FOR DRIVER CALIBRATION

(71) Applicant: SEMICONDUCTOR COMPONENTS INDUSTRIES, LLC, Scottsdale, AZ (US)

(72) Inventor: Seiji Takeuchi, Hashima (JP)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 0 days.

(21) Appl. No.: 18/658,837

(22) Filed: May 8, 2024

(65) Prior Publication Data

US 2024/0291438 A1     Aug. 29, 2024

Related U.S. Application Data

(60) Continuation of application No. 18/450,123, filed on Aug. 15, 2023, now Pat. No. 12,015,381, which is a
(Continued)

(51) Int. Cl.
| | |
|---|---|
| *H03F 1/30* | (2006.01) |
| *G03B 13/36* | (2021.01) |
| *G05F 3/24* | (2006.01) |
| *H02P 25/034* | (2016.01) |
| *H03F 3/45* | (2006.01) |
| *H03M 1/10* | (2006.01) |

(52) U.S. Cl.
CPC ............. *H03F 1/30* (2013.01); *G03B 13/36* (2013.01); *G05F 3/24* (2013.01); *H02P 25/034* (2016.02); *H03F 3/45* (2013.01); *H03F 2200/453* (2013.01); *H03M 1/1009* (2013.01)

(58) Field of Classification Search
CPC ... H03F 1/30; H03F 1/301; H03F 3/45; H03F 3/45183; H03F 3/45748; H03F 2200/453; H03F 2203/45048; H03F 2203/45212; G03B 3/10; G03B 13/36; G03B 2205/0053; G05F 3/24; H02P 25/034; H03M 1/1009
See application file for complete search history.

(56) References Cited

U.S. PATENT DOCUMENTS

| | | | |
|---|---|---|---|
| 10,658,986 | B2 | 5/2020 | Takeuchi |
| 2010/0237950 | A1 | 9/2010 | Cao |

(Continued)

FOREIGN PATENT DOCUMENTS

| | | |
|---|---|---|
| CN | 108011634 A | 5/2018 |
| JP | 2000227801 A | 8/2000 |
| WO | 2011032178 A1 | 3/2011 |

*Primary Examiner* — Jack Dinh
(74) *Attorney, Agent, or Firm* — Dickinson Wright PLLC; Mark E. Scott

(57) ABSTRACT

Driver circuits, systems for driving actuators, and imaging systems with actuators. The driver circuit includes a current comparator circuit, a driver, and a replica circuit. The current comparator circuit includes a first node having a first voltage. The current comparator circuit also includes a second node having a second voltage. The driver includes a first terminal responsive to the second voltage. The driver also includes a second terminal connected to a reference voltage. The replica circuit includes a third terminal connected to the first node. The replica circuit also includes a fourth terminal connected to the second terminal of the driver. The replica circuit also includes a fifth terminal connected to the first terminal of the driver.

20 Claims, 4 Drawing Sheets

Related U.S. Application Data division of application No. 16/848,240, filed on Apr. 14, 2020, now Pat. No. 11,770,105, which is a continuation of application No. 16/002,179, filed on Jun. 7, 2018, now Pat. No. 10,658,986.

(56) References Cited

U.S. PATENT DOCUMENTS

| | | |
|---|---|---|
| 2011/0050194 A1 | 3/2011 | Kuwana et al. |
| 2012/0001892 A1 | 1/2012 | Kojima |
| 2015/0370031 A1 | 12/2015 | Tikkanen et al. |
| 2020/0244230 A1 | 7/2020 | Takeuchi |

METHODS AND APPARATUS FOR DRIVER CALIBRATION

CROSS-REFERENCE TO RELATED APPLICATIONS

This application is a continuation of and claims priority to U.S. Non-Provisional application Ser. No. 18/450,123 filed Aug. 15, 2023, and titled "METHODS AND APPARATUS FOR DRIVER CALIBRATION," which is a divisional of and claims priority to U.S. Non-Provisional application Ser. No. 16/848,240 filed Apr. 14, 2020, and titled "METHODS AND APPARATUS FOR DRIVER CALIBRATION," which claims priority to and is a continuation of U.S. Non-Provisional patent application Ser. No. 16/002,179 filed Jun. 7, 2018, and titled "METHODS AND APPARATUS FOR DRIVER CALIBRATION." These non-provisional applications are incorporated by reference herein as if reproduced in full below.

BACKGROUND

Electronic devices, such as cellular telephones, cameras, and computers, commonly use a lens module in conjunction with an image sensor to capture images. Many imaging systems employ autofocus methods and various signal processing techniques to improve image quality by adjusting the position of the lens relative to the image sensor.

Autofocus systems generally utilize a driver and an actuator to move the lens to an optimal position to increase the image quality. The system also utilizes operation amplifiers to facilitate signal propagation. The operation amplifier, however, may experience an offset voltage, which results in the driver producing an output current that differs from an expected (ideal) current. For high performance drivers, the variation between the actual output current and the ideal must be reduced or removed.

SUMMARY

Various embodiments of the present technology may comprise methods and apparatus for driver calibration. The methods and apparatus may comprise various circuits and/or systems to minimize an offset output current (for example, a drive current) due to an offset voltage in an operational amplifier. The methods and apparatus may comprise a current comparator circuit and a replica circuit that operate in conjunction with each other to monitor the drive current and provide a feedback signal, which is then used to adjust the drive current and improve the accuracy of the drive current.

The present disclosure provides a circuit including, in one implementation, a current comparator circuit, a driver, and a replica circuit. The current comparator circuit includes a first node having a first voltage. The current comparator circuit also includes a second node having a second voltage. The driver includes a first terminal responsive to the second voltage. The driver also includes a second terminal connected to a reference voltage. The replica circuit includes a third terminal connected to the first node. The replica circuit also includes a fourth terminal connected to the second terminal of the driver. The replica circuit also includes a fifth terminal connected to the first terminal of the driver.

The present disclosure also provides a system including, in one implementation, an actuator and a control circuit. The control circuit is configured to control the actuator. The control circuit includes a current comparator circuit, a driver, and a replica circuit. The current comparator circuit includes a first node having a first voltage. The current comparator circuit also includes a second node having a second voltage. The driver includes a first terminal responsive to the second voltage. The driver also includes a second terminal connected to a reference voltage. The replica circuit includes a third terminal connected to the first node. The replica circuit also includes a fourth terminal connected to the second terminal of the driver. The replica circuit also includes a fifth terminal connected to the first terminal of the driver.

The present disclosure further provides an imaging system including, in one implementation, a lens, an actuator, a current comparator circuit, a driver, and a replica circuit. The actuator is configured to adjust a position of the lens. The current comparator circuit includes a first node having a first voltage. The current comparator circuit also includes a second node having a second voltage. The driver is configured to control the actuator. The driver includes a first terminal responsive to the second voltage. The driver also includes a second terminal connected to a reference voltage. The replica circuit includes a third terminal connected to the first node. The replica circuit also includes a fourth terminal connected to the second terminal of the driver. The replica circuit also includes a fifth terminal connected to the first terminal of the driver.

BRIEF DESCRIPTION OF THE DRAWINGS

A more complete understanding of the present technology may be derived by referring to the detailed description when considered in connection with the following illustrative figures. In the following figures, like reference numbers refer to similar elements and steps throughout the figures.

DETAILED DESCRIPTION

The present technology may be described in terms of functional block components and various processing steps. Such functional blocks may be realized by any number of components configured to perform the specified functions and achieve the various results. For example, the present technology may employ various actuators, sensors, lenses, current generators, controllers, signal converters, semiconductor devices, such as transistors and capacitors, and the like, which may carry out a variety of functions. In addition, the present technology may be practiced in conjunction with any number of systems, such as automotive, aerospace, medical, scientific, surveillance, and consumer electronics, and the systems described are merely exemplary applications for the technology. Further, the present technology may employ any number of conventional techniques for capturing image data, sampling image data, processing image data, and the like.

Figure 1:
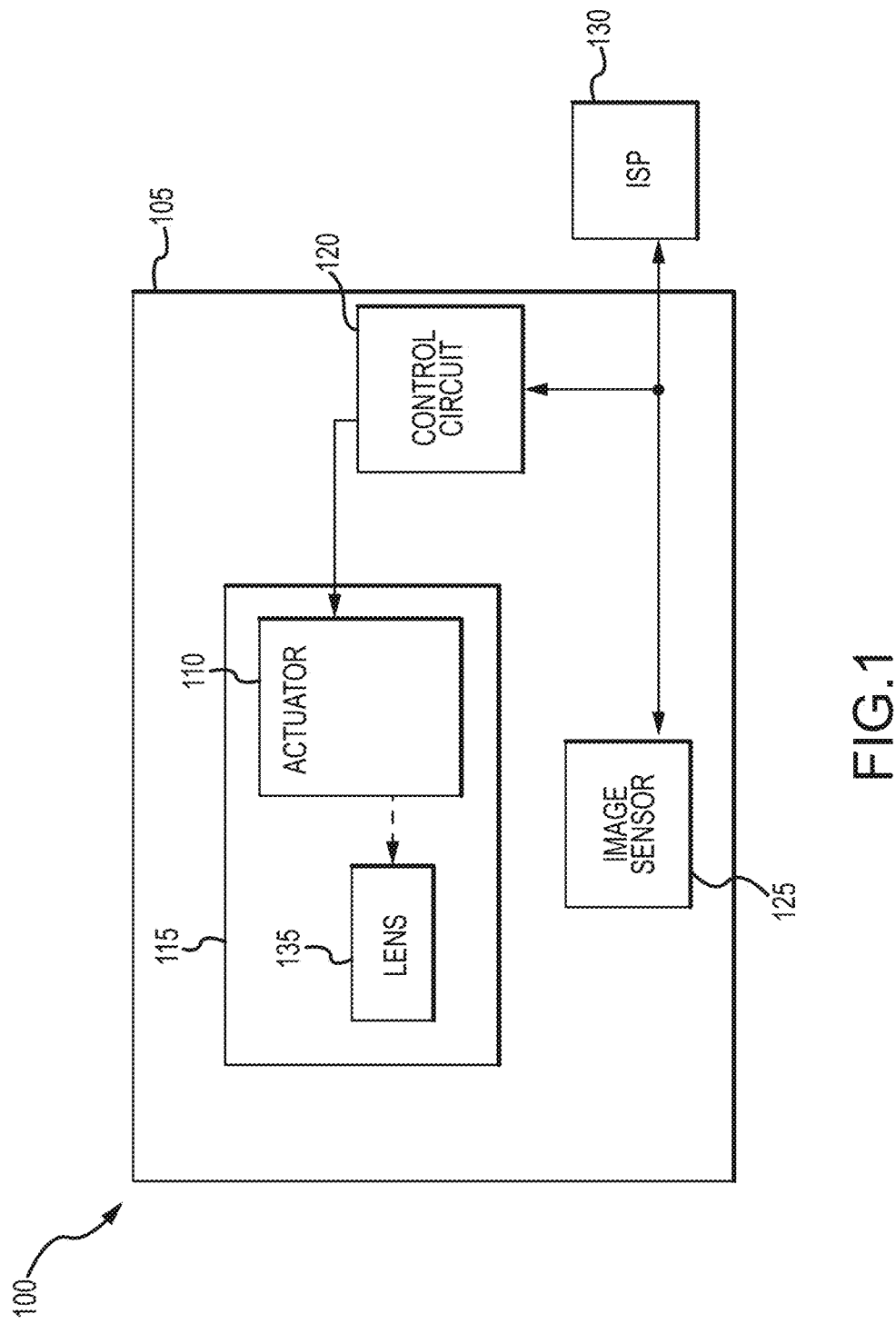
FIG. 1 is a block diagram of an imaging system in accordance with an exemplary embodiment of the present technology.

Methods and apparatus for driver calibration according to various aspects of the present technology may operate in conjunction with any suitable electronic system, such as imaging systems, "smart devices," wearables, consumer electronics, and the like. Referring to FIG. 1, an example of an imaging system 100 may be incorporated into an electronic device, such as a digital camera or portable computing device. For example, in various embodiments, the imaging system 100 may comprise a camera module 105 and an image signal processor (for example, ISP 130).

The camera module 105 may capture image data and perform various operating functions, such as autofocus and/or optical image stabilization. For example, the camera module 105 may comprise an image sensor 125, a lens module 115 positioned adjacent to the image sensor 125, and a control circuit 120. The control circuit 120 and the lens module 115 may be configured to communicate with each other and operate together to automatically focus an object or a scene on the image sensor 125.

The image sensor 125 may be suitably configured to capture image data. For example, the image sensor 125 may comprise a pixel array (not shown) to detect light and convey information that constitutes an image by converting the variable attenuation of light waves (as they pass through or reflect off the object) into electrical signals. The pixel array may comprise a plurality of pixels arranged in rows and columns, and the pixel array may contain any number of rows and columns, for example, hundreds or thousands of rows and columns. Each pixel may comprise any suitable photosensor, such as a photogate, a photodiode, and the like, to detect light and convert the detected light into a charge. The image sensor 125 may be implemented in conjunction with any appropriate technology, such as active pixel sensors in complementary metal-oxide-semiconductors (CMOS) and charge-coupled devices.

The lens module 115 may be configured to focus light on a sensing surface of the image sensor 125. For example, the lens module 115 may comprise a lens 135, with a fixed diameter, positioned adjacent to the sensing surface of the image sensor 125. The lens module 115 may further comprise an actuator 110, for example a linear resonant actuator, such as a voice coil motor (VCM), configured to move the lens 135 along an x-, y-, and z-axis.

In various embodiments, the imaging system 100 may be configured to move portions of the lens module 115 that secure the lens 135 to perform autofocus functions. For example, the lens module 115 may comprise a telescoping portion (not shown) that moves relative to a stationary portion (not shown). In various embodiments, the telescoping portion may secure the lens 135. As such, the actuator 110 may move the telescoping portion to shift the lens 135 away from or closer to the image sensor 125 to focus the object or scene on the image sensor 125. In various embodiments, the image sensor 125 may be fixed to the stationary portion or may be arranged at a fixed distance from the stationary portion.

In various embodiments, the ISP 130 may perform various digital signal processing functions, such as color interpolation, color correction, facilitate auto-focus, exposure adjustment, noise reduction, white balance adjustment, compression, and the like, to produce an output image. The ISP 130 may comprise any number of semiconductor devices, such as transistors, capacitors, and the like, for performing calculations, transmitting and receiving image pixel data, and a storage unit for storing pixel data, such as random-access memory, non-volatile memory or any other memory device suitable for the particular application. In various embodiments, the ISP 130 may be implemented with a programmable logic device, such as a field programmable gate array (FPGA) or any other device with reconfigurable digital circuits. In other embodiments, the ISP 130 may be implemented in hardware using non-programmable devices. The ISP 130 may be formed partially or entirely within an integrated circuit in silicon using any suitable complementary metal-oxide semiconductor (CMOS) techniques or fabrication processes, in an ASIC (application-specific integrated circuit), using a processor and memory system, or using another suitable implementation.

The ISP 130 may transmit the output image to an output device, such as a display screen or a memory component, for storing and/or viewing the image data. The output device may receive digital image data, such as video data, image data, frame data, and/or gain information from the ISP 130. In various embodiments, the output device may comprise an external device, such as a computer display, memory card, or some other external unit.

The control circuit 120 controls and supplies power to various devices within the system. For example, the control circuit 120 may control and supply power to the lens module 115 to move the actuator 110 and/or lens 135 to a desired position. The control circuit 120 may operate in conjunction with the ISP 130, the image sensor 125, and/or other systems to determine the appropriate amount of power and/or current to supply to the actuator 110. The control circuit 120 may comprise any suitable device and/or system capable of providing energy to the actuator 110. In an exemplary embodiment, the control circuit 120 may comprise a driver 235, a controller 210, a digital-to-analog converter (for example, DAC 215), an operational amplifier (for example, op-amp 220), a current generator circuit 205, a feedback circuit 260, a current comparator circuit 250, and a replica circuit 225.

The controller 210 controls operation of the DAC 215. The controller 210 may receive signals from other components in the system, such as a clock signal (not shown), that the controller 210 utilizes to perform various control operations and/or generate various control signals. In an exemplary embodiment, the controller 210 may supply a DAC code to the DAC 215. The DAC code may comprise a first digital code. The controller 210 may generate the DAC code according to information from the image sensor 125, the ISP 130, and/or other relevant information.

According to an exemplary embodiment, the controller 210 may further comprise a memory (not shown) configured to store a plurality of offset calibration codes. The offset calibration codes may be stored, for example, in a look-up table or other suitable storage medium. The controller 210 may select and transmit one of the offset calibration codes (OCC) to the DAC 215 according to a comparator voltage $V_{COMP}$ from the current comparator circuit 250. The OCC may comprise a second digital code.

The controller 210 may comprise any suitable circuit and/or system for generating digital signals, such as the DAC code and the OCC. For example, the controller 210 may comprise various logic circuits configured to perform comparisons, arithmetic functions, signal conversion, and the like.

The DAC 215 may convert a digital value to an analog value (for example, a voltage) and generate output signals according to various input signals. According to an exemplary embodiment, the DAC 215 may be connected to the controller 210 and receive the DAC code and the OCC. The DAC 215 may generate a DAC output signal $V_{DAC}$ according to the DAC code, and may further generate a calibration voltage $V_{CAL}$ according to the OCC. The DAC 215 may be further connected to the op-amp 220 and configured to transmit the DAC output signal $V_{DAC}$ to an input terminal of the op-amp 220. The DAC 215 may be further connected to the feedback circuit 260 and configured to transmit the calibration voltage $V_{CAL}$ to the feedback circuit 260.

The feedback circuit 260 may be configured to generate a feedback voltage $V_F$ according to the calibration voltage $V_{CAL}$ and/or other signals. For example, the feedback circuit 260 may comprise various circuits, such as amplifiers, resistors, and the like, to amplify desired signals, amplify a differential signal, measure a voltage, and/or detect a current. According to an exemplary embodiment, the feedback voltage $V_F$ is based on the calibration voltage $V_{CAL}$ and a voltage drop across a sense resistor 245.

The sense resistor 245 may be connected to the driver 235 at a first end and a ground at a second end. The sense resistor 245 may be further connected to the feedback circuit 260 with connectors that connect the first end and the second end to the feedback circuit 260. Accordingly, the feedback circuit 260 can detect a drive current $I_{DR}$ by measuring the voltage drop across the sense resistor 245.

The op-amp 220 may be configured to receive input signals and amplify a difference between the input signals (i.e., a differential input). The op-amp 220 may comprise an inverting terminal (−) for receiving a first input signal and a non-inverting terminal (+) for receiving a second input signal. In an exemplary embodiment, the op-amp 220 is connected to the DAC 215 and configured to receive the DAC output signal $V_{DAC}$ at the non-inverting terminal (+) and the feedback voltage $V_F$ at the inverting terminal (−). The op-amp 220 may comprise a conventional op-amp formed using transistors, resistors, and capacitors.

Due to the manufacturing process, the transistors used to form the op-amp 220 may not be exactly matched, which causes the op-amp 220 to have an output $V_{OUT\_AMP}$ that is zero at a non-zero value of the differential input. This is generally referred to as the input offset voltage and this offset contributes to the offset current.

The current generator circuit 205 may be configured to generate a reference current $I_{REF}$ and supply various bias voltages to the current comparator circuit 250, such as bias voltages $V_{bias1}$, $V_{bias2}$, $V_{bias3}$, and $V_{bias4}$. The current generator circuit 205 may comprise any circuits and/or devices suitable for generating a desired reference current. For example, the current generator circuit 205 may comprise a bandgap current reference circuit 255 and various transistors.

The bandgap current reference circuit 255 may comprise a conventional circuit suitable for generating a desired reference current. The bandgap current reference circuit 255 may operate in conjunction with various transistors to generate the reference current $I_{REF}$.

The current comparator circuit 250 determines if a current signal exceeds a predetermined threshold current $I_{COMP\_TH}$ and generates the comparator output voltage $V_{COMP}$ accordingly. The current comparator circuit 250 may be configured as a folded-cascode comparator. For example, the current comparator circuit 250 may comprise a plurality of transistors, such as transistors M1:M4, connected in series and wherein each transistor receives a different bias voltage, such as bias voltages $V_{bias1}$, $V_{bias2}$, $V_{bias3}$, and $V_{bias4}$. Transistors M1 and M2 may comprise PMOS transistors and transistors M3 and M4 may comprise NMOS transistors.

According to an exemplary embodiment, the current comparator circuit 250 may be connected to the current generator circuit 205 to receive various bias voltages to generate fixed currents through transistors M1, M2, M3, and M4. Accordingly, the predetermined threshold current $I_{COMP\_TH}$ is established according to the bias voltages and is proportional to the reference current $I_{REF}$ and is described according to the following equation: $I_{COMP\_TH} = I_{REF} \times (1/X)$, where $I_{REF}$ is the reference current and 1/X is a ratio of the number of transistors in the current comparator circuit 250 to the number of transistors in the current generator circuit 205.

According to an exemplary embodiment, the current comparator circuit 250 may be connected to the replica circuit 225 at a first node N1, wherein the first node N1 is located between the transistors M1 and M2. A voltage at the first node N1 may be referred to as the first node voltage $V_{N1}$. The current comparator circuit 250 may be further connected to the controller 210, via a buffer amplifier 240, at a second node N2, wherein the second node is located between transistors M2 and M3. A voltage at the second node N2 may be referred to as the second node voltage $V_{N2}$.

The current comparator circuit 250 may be further connected to a supply voltage $V_{DD}$. For example, transistor M1 may be directly connected to the supply voltage $V_{DD}$ and transistors M2:M4 are connected indirectly.

The driver 235 (i.e., the driver circuit) facilitates movement of the lens 135 to a desired position. For example, the driver 235 may generate and supply the drive current $I_{DR}$ to the actuator 110. The driver 235 may vary the magnitude and direction of the drive current $I_{DR}$ to achieve the desired position of the lens 135. The actuator 110 is responsive to the drive current $I_{DR}$ and moves the lens 135 an amount that is proportion to the drive current $I_{DR}$. In general, the drive current $I_{DR}$ may be described according to following equation: $I_{DR} = A \times I_{REF}$, where A is a gain value and $I_{REF}$ is the reference current.

The driver 235 may comprise any circuit suitable for driving the actuator 110 in response to an input signal. For example, the driver 235 may be configured as an H-bridge driver comprising a plurality of transistors, such as transistors M6:M9. The driver 235 may be further configured to receive and respond to the op-amp output $V_{OUT\_AMP}$. For example, a gate terminal of transistor M7 may be connected to an output terminal of the op-amp 220 and operate according to the op-amp output $V_{OUT\_AMP}$. In an exemplary embodiment, transistors M6 and M8 are configured as P-channel MOSFETS (PMOS) and M7 and M9 are configured as N-channel MOSFETS (NMOS), wherein each transistor has a gate terminal, a drain terminal, and a source terminal.

In an exemplary embodiment, the driver 235 may be coupled to the actuator 110 at a third node N3, wherein the third node N3 is located between transistors M6 and M7, and a fourth node N4, wherein the fourth node N4 is located between transistors M8 and M9. A voltage at the third node N3 may be referred to as the third node voltage $V_{N3}$ and a voltage at the fourth node N4 may be referred to as the fourth node voltage $V_{N4}$.

Figure 2:
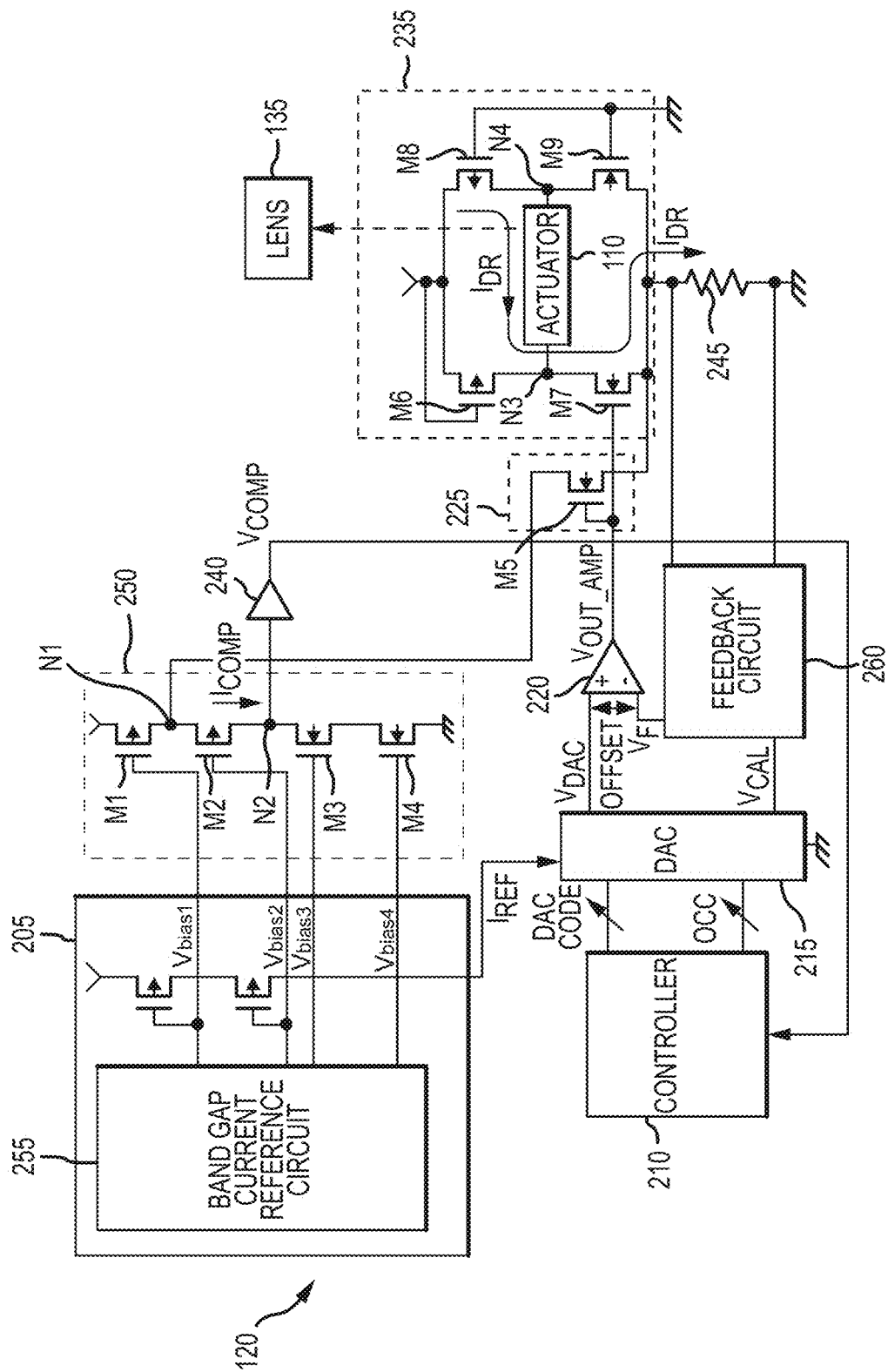
FIG. 2 is a circuit diagram of a control circuit in accordance with an exemplary embodiment of the present technology.

Accordingly, selectively operating the transistors M6:M9 will dictate operation of the actuator 110 and/or the flow of the drive current $I_{DR}$. For example, the drive current $I_{DR}$ may flow through the actuator 110 in either a first direction (i.e., a forward direction, as illustrated in FIG. 2) or an opposite second direction (i.e., a reverse direction). The direction of the drive current $I_{DR}$ may be based on the desired position of the lens 135.

According to an exemplary embodiment, the transistors M6:M9 of the driver 235 have a minimum length, based on the fabrication process, to reduce the on-resistance of the driver 235. In general, as a drain-to-source voltage increases, the drive current $I_{DR}$ in short-channel devices increases more compared to long-channel devices.

The replica circuit 225 generates a current (i.e., a replica current $I_{REP}$) that is proportional to the drive current $I_{DR}$. The replica circuit 225 may be connected to the current comparator circuit 250, the op-amp 220, and the driver 235. The replica circuit 225 may comprise any circuit suitable for generating a current that is proportional to the drive current $I_{DR}$. For example, the replica circuit 225 may comprise a transistor M5, where transistor M5 is an NMOS transistor, and wherein a gate terminal of transistor M5 may be connected to the output terminal of the op-amp 220 and receives the op-amp output $V_{OUT\_AMP}$. A source terminal of transistor M5 may be connected to a source terminal of transistor M7. A drain terminal of transistor M5 may be connected to the first node N1 of the current comparator circuit 250 and the replica current $I_{REP}$ flows through the transistor M5 according to the drive current $I_{DR}$.

As the replica current $I_{REP}$ changes, the current comparator circuit 250 compares the replica current $I_{REP}$ to the threshold current $I_{COMP\_TH}$ and outputs the comparator voltage $V_{COMP}$ according to the difference. For example, if the replica current $I_{REP}$ is less than the threshold current $I_{COMP\_TH}$, then the comparator voltage $V_{COMP}$ is HIGH (for example, a digital 1), and if the replica current $I_{REP}$ is greater than the threshold current $I_{COMP\_TH}$, then the comparator voltage $V_{COMP}$ is LOW (for example, a digital 0).

According to various embodiments, the methods and apparatus for driver calibration operates to reduce or otherwise remove an offset in the drive current $I_{DR}$. For example, and referring to FIG. 3 the offset is defined as the difference between an actual drive current prior to calibration and an ideal drive current (where the drive current is zero when the DAC value is zero). Accordingly, the methods and apparatus for driver calibration operate to substantially match the actual drive current to the ideal drive current. After calibration, the actual drive current may be within less than 1 least significant bit (LSB) of the ideal drive current. For example, 1 LSB may be equal to 200 uA.

Figure 3:
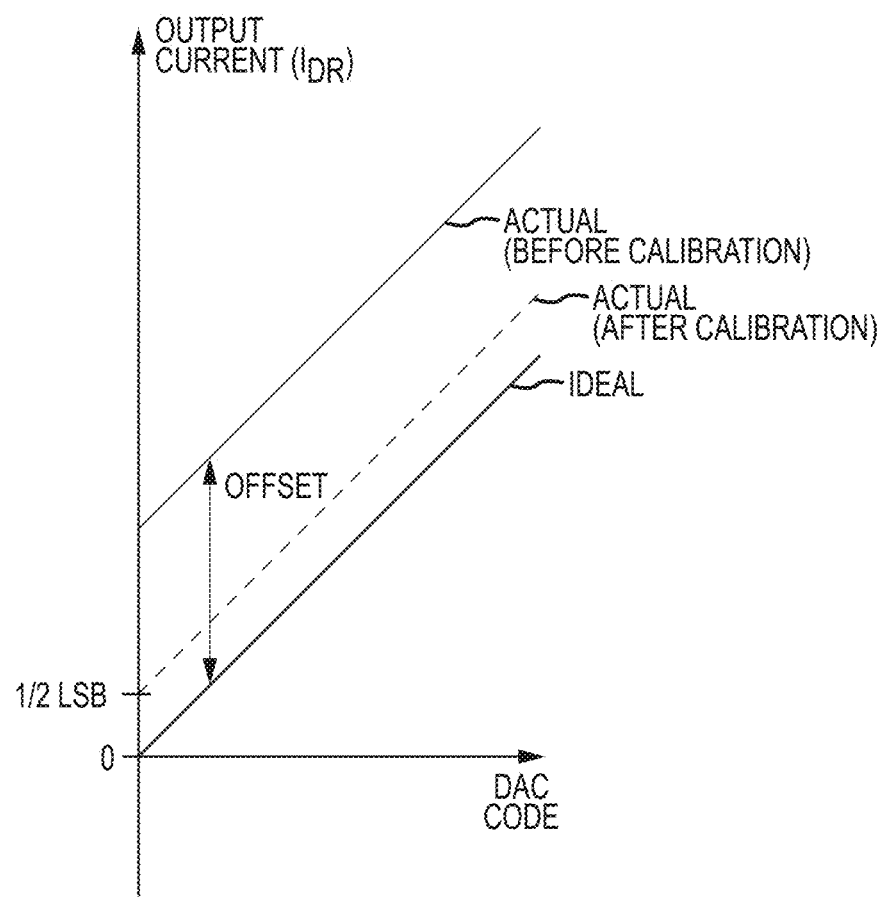
FIG. 3 is a graph of an ideal output current, an actual output current, and a corrected output current of a driver in accordance with an exemplary embodiment of the present technology.
Figure 4:
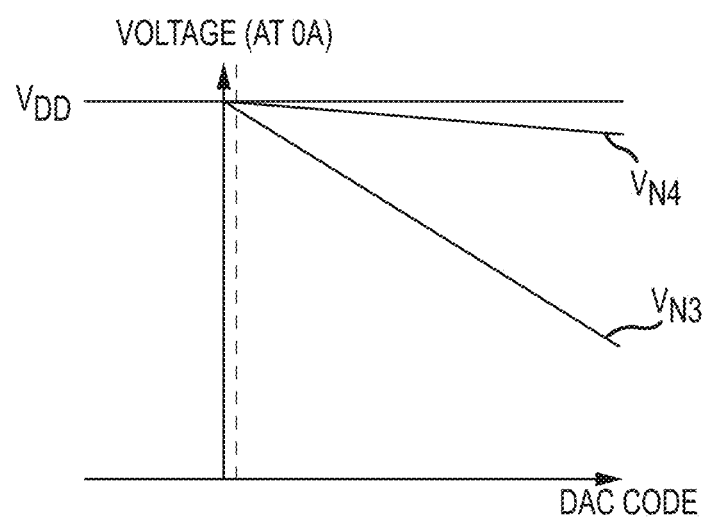
FIG. 4 is a graph of driver voltages in accordance with an exemplary embodiment of the present technology.

Referring to FIGS. 2-4, during operation, the replica circuit 225 generates the replica current $I_{REP}$ according to the drive current $I_{DR}$. This is accomplished by ensuring that a gate-to-source voltage of the replica transistor M5 ($V_{gs\_M5}$) is the same as a gate-to-source voltage of the transistor M7 ($V_{gs\_M7}$), and that a drain-to-source voltage of the replica transistor M5 ($V_{ds\_M5}$) is the same as a drain-to-source voltage of the transistor M7 ($V_{ds\_M5}$). Since the gate terminal of the replica transistor M5 and the gate terminal of the transistor M7 receive the same voltage (for example, $V_{OUT\_AMP}$), the gate-to-source voltage of the replica transistor M5 ($V_{gs\_M5}$) is the same as the gate-to-source voltage of the transistor M7 ($V_{gs\_M7}$). Further, since the drain terminal of the replica transistor M5 is connected to the first node N1, which is determined by a bias voltage $V_{BIAS2}$ and is approximately equal to the supply voltage $V_{DD}$ minus an overdrive voltage $V_{OD}$ (i.e., $V_{N1}=V_{DD}-V_{OD}$), the drain-to-source voltage of the replica transistor M5 ($V_{ds\_M5}$) is substantially the same as the drain-to-source voltage of transistor M7 ($V_{ds\_M7}$) when the drive current $I_{DR}$ is approximately 0 A. The overdrive voltage $V_{OD}$ may range from approximately 0.1V to 0.2V.

According to an exemplary operation, the current comparator circuit 250 compares the replica current $I_{REP}$ to the threshold current $I_{COMP\_TH}$. For example, if the threshold current $I_{COMP\_TH}$ is, for example, 3 uA, then the current comparator circuit 250 compares the replica current and determines if the replica current is less than or greater than 3 uA and generates the comparator voltage $V_{COMP}$ according to the comparison. If the replica current $I_{REP}$ is less than 3 uA, then the comparator voltage $V_{COMP}$ is HIGH, and if the replica current $I_{REP}$ is greater than 3 uA, then the comparator voltage $V_{COMP}$ is LOW.

The current comparator circuit 250 then transmits the comparator voltage $V_{COMP}$ to the controller 210. The controller 210 receives and responds to the comparator voltage $V_{COMP}$ by increasing or decreasing the OCC. For example, if the comparator voltage $V_{COMP}$ is HIGH, then the OCC is decreased, and if the comparator voltage $V_{COMP}$ is LOW, then the OCC is increased. The DAC 215 utilizes the OCC to change or adjust the calibration voltage $V_{CAL}$, which is then used to generate the feedback voltage $V_F$ and generate the op-amp output $V_{OUT\_AMP}$.

According to an exemplary method, the calibration is performed when the drive current $I_{DR}$ is approximately 0 A. Referring to FIG. 4, when the drive current is approximately 0 A, the supply voltage $V_{DD}$, the voltage at the third node N3 ($V_{N3}$) and the voltage at the fourth node N4 ($V_{N4}$), are substantially the same.

According to the above and as described with respect to the forward direction, the offset current may be corrected in the reverse direction as well.

In the foregoing description, the technology has been described with reference to specific exemplary embodiments. Various modifications and changes may be made, however, without departing from the scope of the present technology as set forth. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any appropriate order and are not limited to the explicit order presented in the specific examples. Additionally, the components and/or elements recited in any system embodiment may be combined in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology.

What is claimed is:

1. An apparatus comprising:
a driver configured to, using a drive current, cause adjustment to a position of a lens;
a replica circuit configured to generate a replica current, wherein the replica current corresponds to the drive current;
a comparator configured to produce a comparison signal based on a comparison of the replica current and a threshold current; and
a controller configured to control the drive current based on a state of the comparison signal.

2. The apparatus of claim 1, further comprising a digital-to-analog converter (DAC), wherein the controller is configured to, based on the state of the comparison signal, provide a DAC code to cause the DAC to generate a DAC output voltage and a correction code to cause the DAC to generate a calibration voltage.

3. The apparatus of claim 2, further comprising:
an amplifier coupled to receive the DAC output voltage on a first input; and
a feedback circuit coupled to receive the calibration voltage, wherein the feedback circuit is configured to generate a feedback voltage using calibration voltage, wherein the amplifier is coupled to receive the feedback voltage on a second input;
wherein the amplifier is configured to generate a control voltage based on the DAC output voltage and the feedback voltage and further configured to control the drive current and the replica current using the control voltage.

4. The apparatus of claim 3, further comprising a sense resistor, wherein the sense resistor is configured to generate a sense voltage using the drive current, and wherein the feedback circuit is configured to generate the feedback voltage using the sense voltage.

5. The apparatus of claim 2, wherein the controller is configured to increase a value of the correction code in response to receiving the comparison signal in a first state, and further configured to decrease the value of the correction code in response to receiving the correction code in a second state.

6. The apparatus of claim 2, further comprising a current generator configured to generate a reference current, wherein the DAC is configured to generate the DAC output voltage and the calibration voltage using the reference current.

7. The apparatus of claim 6, further comprising a bandgap circuit configured to generate a plurality of bias voltages, wherein the current generator is configured to generate the reference current using at least a subset of the plurality of bias voltages.

8. The apparatus of claim 7, wherein the comparator is configured to generate the threshold current using the plurality of bias voltages.

9. The apparatus of claim 1, wherein the comparator comprises a folded cascode circuit.

10. The apparatus of claim 1, further comprising an actuator, wherein the actuator is configured to control the position the lens using the drive current.

11. A method comprising:
generating, using a driver, a drive current;
adjusting a position of a lens using the drive current;
generating, using a replica circuit, a replica current that corresponds to the drive current;
comparing, using a comparator, the replica current and a threshold current;
producing, using the comparator, a comparison signal based on the comparing; and
controlling, using a controller, the drive current based on a state of the comparison signal.

12. The method of claim 11, further comprising:
producing, using the controller, a digital-to-analog converter (DAC) code based on the state of the comparison signal;
producing, using the controller, a correction code based on the state of the comparison signal;
generating, using a DAC, a DAC output voltage based on the DAC code; and
generating, using the DAC, a calibration voltage based on the correction code.

13. The method of claim 12, further comprising:
receiving, at a first input of an amplifier, the DAC output voltage;
receiving, at a feedback circuit, the calibration voltage;
producing, by the feedback circuit and using the calibration voltage, a feedback voltage;
receiving, at a second input of the amplifier, the feedback voltage;
generating, using the amplifier, a control voltage based on the DAC output voltage and the feedback voltage; and
controlling the drive current and the replica current using the control voltage.

14. The method of claim 13, further comprising:
providing a sense voltage to the feedback circuit, wherein the sense voltage is a product of the drive current and a resistance of a sense resistor; and
generating the feedback voltage, by the feedback circuit, based on the sense voltage.

15. The method of claim 12, further comprising:
producing, by a bandgap circuit, a plurality of bias voltages;
generating, by a current generator and using at least a subset of the plurality of bias voltages, a reference current;
establishing, by the comparator, the threshold current using the plurality of bias voltages; and
providing the reference current to the DAC, wherein the DAC output voltage and the calibration voltage are generated by the DAC using the reference current.

16. A system comprising:
an image sensor configured to capture image data;
a lens configured to focus light on a surface of the image sensor;
an actuator configured to adjust a position of the lens; and
a control circuit including:
a driver configured to provide a drive current to the actuator, wherein the actuator is configured to adjust the position of the lens based on the drive current;
a replica circuit configured to generate a replica current, wherein the replica current corresponds to the drive current;
a comparator configured to produce a comparison signal based on a comparison of the replica current and a threshold current; and
a controller configured to control the drive current based on a state of the comparison signal.

17. The system of claim 16, wherein the control circuit further includes:
- a digital-to-analog converter (DAC) coupled to the controller, wherein the controller is configured to, based on the state of the comparison signal, provide a DAC code and a correction code to the DAC, and wherein the DAC is configured to generate a DAC output voltage and a calibration voltage based on the DAC code and the correction code, respectively;
- an amplifier coupled to receive the DAC output voltage on a first input;
- a sense resistor configured to produce a sense voltage that is a product of the drive current and a resistance value of the sense resistor; and
- a feedback circuit configured to generate a feedback voltage using the calibration voltage and the sense voltage, wherein the amplifier is coupled to receive the feedback voltage on a second input;
- wherein the amplifier is configured to generate a control voltage based on the DAC output voltage and the feedback voltage and further configured to control the drive current and the replica current using the control voltage.

18. The system of claim 17, wherein the controller is configured to increase a value of the correction code in response to receiving the comparison signal in a first state, and further configured to decrease the value of the correction code in response to receiving the correction code in a second state.

19. The system of claim 17, wherein the control circuit further includes:
- a current generator configured to generate a reference current, wherein the DAC is configured to generate the DAC output voltage and the calibration voltage using the reference current; and
- a bandgap circuit configured to generate a plurality of bias voltages, wherein the current generator is configured to generate the reference current using at least a subset of the plurality of bias voltages; and
- wherein the comparator is configured to generate the threshold current using the plurality of bias voltages.

20. The system of claim 16, wherein the comparator comprises a folded cascode circuit.

* * * * *